United States Patent
Wu et al.

(10) Patent No.: US 10,504,998 B2
(45) Date of Patent: Dec. 10, 2019

(54) SEMICONDUCTOR STRUCTURE AND METHOD OF FORMING THE SAME

(71) Applicant: TAIWAN SEMICONDUCTOR MANUFACTURING COMPANY LTD., Hsinchu (TW)

(72) Inventors: Cheng-Ta Wu, Chiayi County (TW); Yi-Hsien Lee, Kaohsiung (TW); Wei-Ming You, Taipei (TW); Ting-Chun Wang, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 3 days.

(21) Appl. No.: 15/702,012

(22) Filed: Sep. 12, 2017

(65) Prior Publication Data
US 2018/0012963 A1    Jan. 11, 2018

Related U.S. Application Data

(63) Continuation of application No. 14/689,786, filed on Apr. 17, 2015, now Pat. No. 9,768,261.

(51) Int. Cl.
| | |
|---|---|
| *H01L 29/167* | (2006.01) |
| *H01L 29/06* | (2006.01) |
| *H01L 29/49* | (2006.01) |
| *H01L 29/66* | (2006.01) |
| *H01L 21/02* | (2006.01) |

(52) U.S. Cl.
CPC ........ *H01L 29/167* (2013.01); *H01L 29/0649* (2013.01); *H01L 29/49* (2013.01); *H01L 29/66545* (2013.01); *H01L 29/66795* (2013.01); *H01L 21/0262* (2013.01); *H01L 21/02529* (2013.01); *H01L 21/02532* (2013.01); *H01L 21/02579* (2013.01)

(58) Field of Classification Search
CPC .......... H01L 29/66545; H01L 29/6656; H01L 21/28114; H01L 29/42376
See application file for complete search history.

(56) References Cited

U.S. PATENT DOCUMENTS

| | | | |
|---|---|---|---|
| 6,716,689 B2 | 4/2004 | Bae et al. |
| 8,772,109 B2 | 7/2014 | Colinge |
| 8,785,285 B2 | 7/2014 | Tsai et al. |
| 8,816,444 B2 | 8/2014 | Wann et al. |

(Continued)

OTHER PUBLICATIONS

Office action dated Jun. 29, 2018 for Chinese counterpart application 201510760358.9.

*Primary Examiner* — Mohammed R Alam
(74) *Attorney, Agent, or Firm* — WPAT, P.C., Intellectual Property Attorneys; Anthony King

(57) ABSTRACT

A semiconductor structure and a method for forming the same are provided. The semiconductor structure includes: a substrate; a fin structure protruding from the substrate, the fin structure extending along a first direction; isolation features disposed on both sides of the fin structure; a gate structure over the fin structure and extending on the isolation features along a second direction perpendicular to the first direction; and wherein the gate structure includes a first segment and a second segment, the second segment being over the first segment and including a greater dimension in the first direction than that of the first segment.

18 Claims, 15 Drawing Sheets

(56) References Cited

U.S. PATENT DOCUMENTS

| | | |
|---|---|---|
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2009/0206406 A1 | 8/2009 | Rachmady et al. |
| 2012/0032280 A1* | 2/2012 | Kirkpatrick ....... H01L 21/28044 257/411 |
| 2013/0082311 A1* | 4/2013 | Cheng ................. H01L 29/7834 257/288 |
| 2014/0084340 A1* | 3/2014 | Wang ................. H01L 29/0684 257/190 |
| 2015/0041913 A1* | 2/2015 | An ....................... H01L 29/7856 257/369 |
| 2015/0221676 A1* | 8/2015 | Holt .................. H01L 29/66795 257/347 |
| 2016/0020323 A1* | 1/2016 | Wu .................... H01L 29/7848 257/409 |

\* cited by examiner

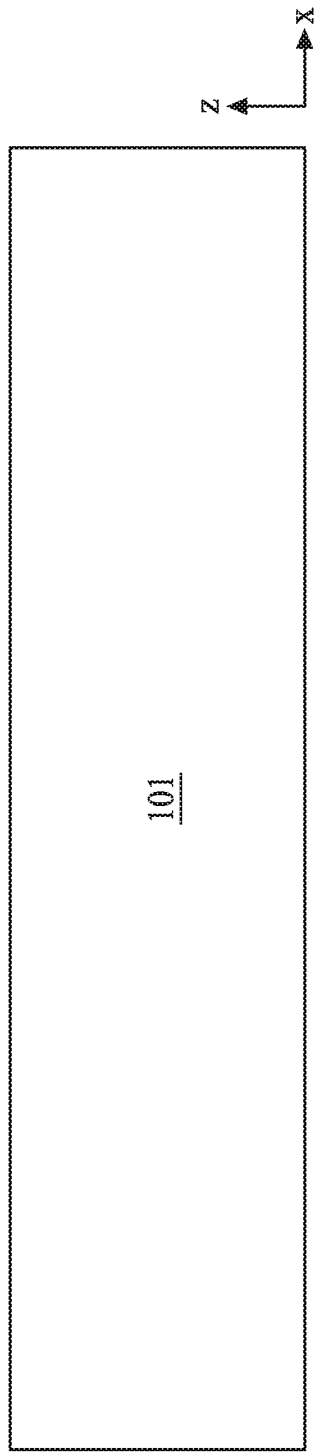

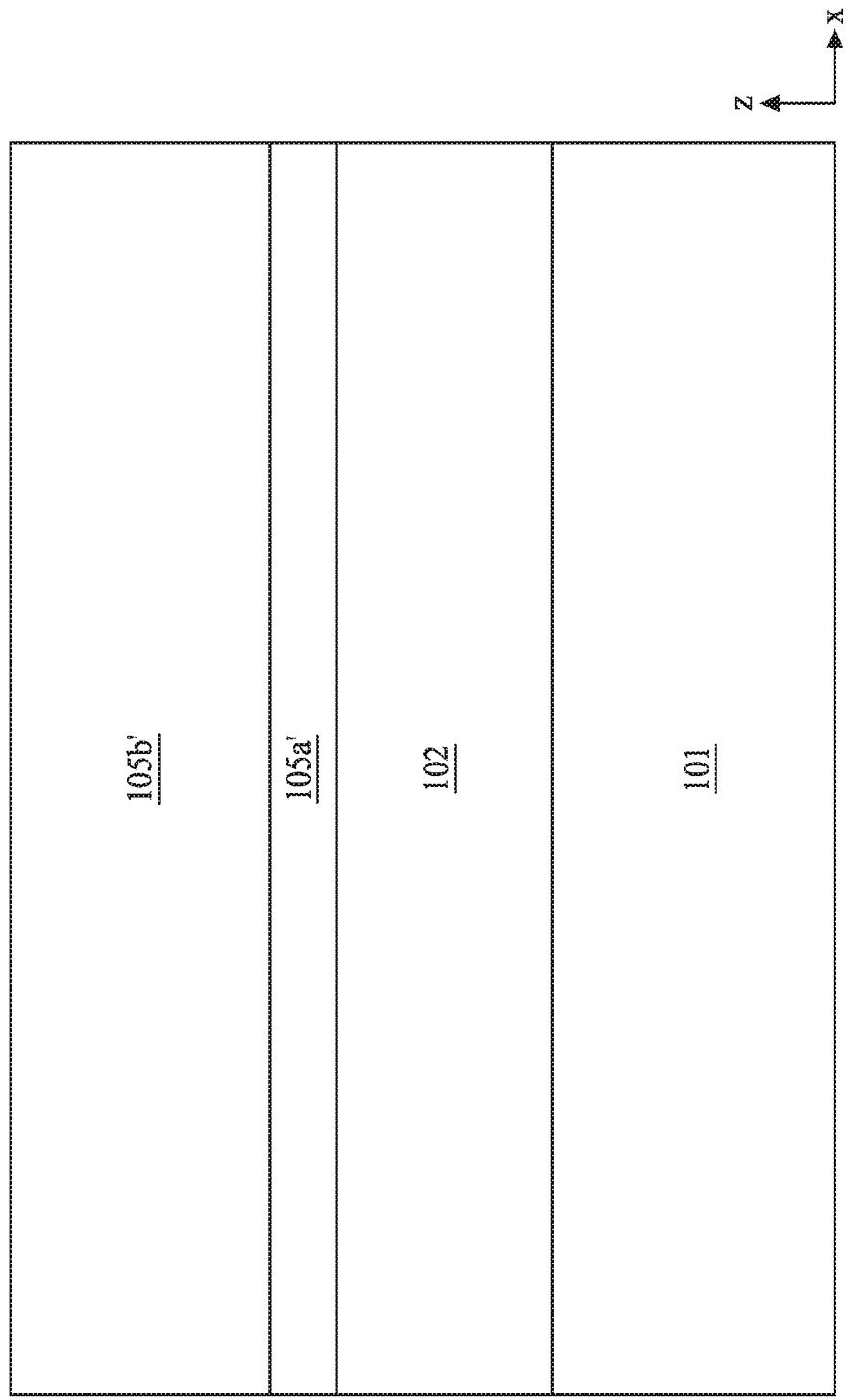

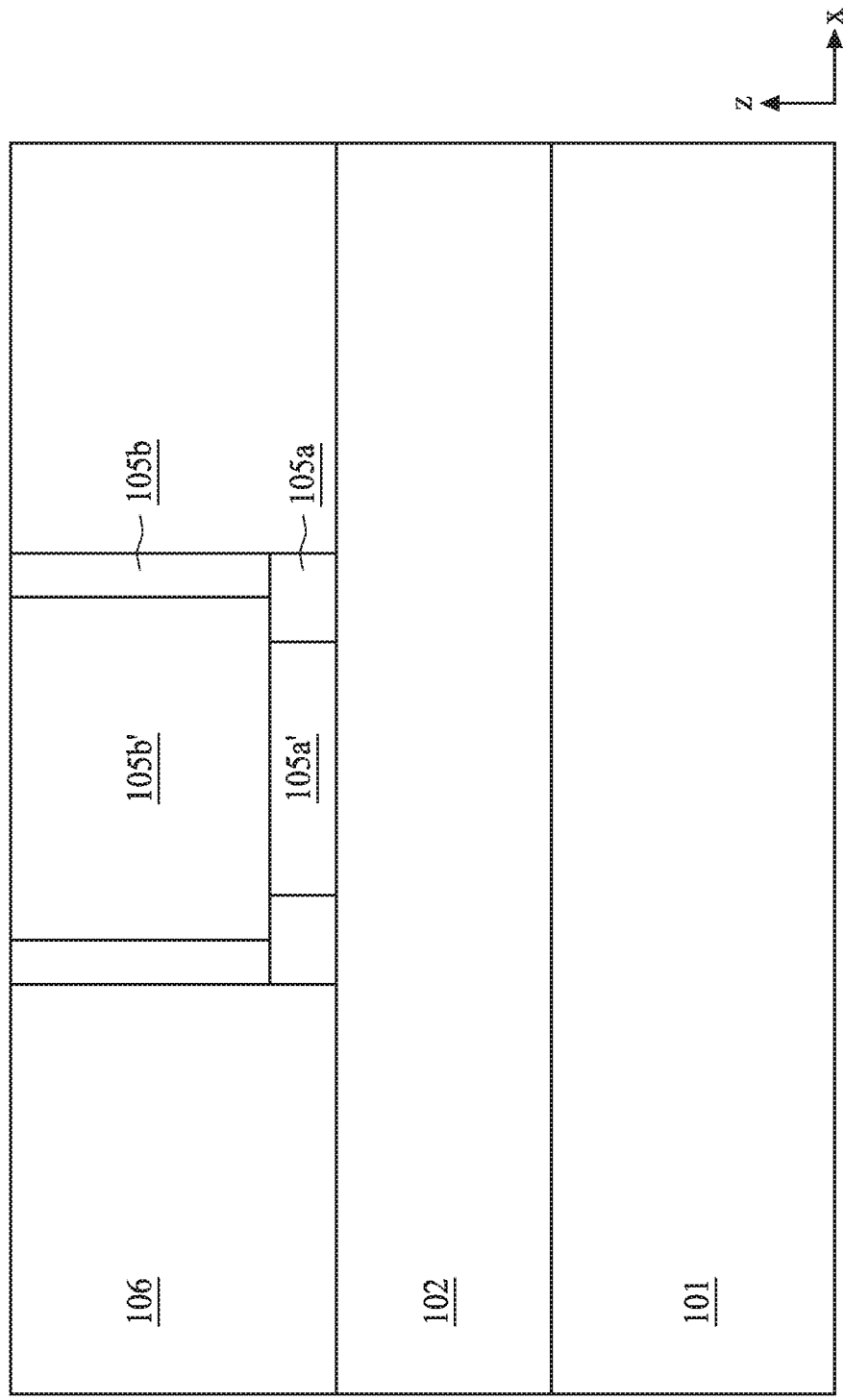

SEMICONDUCTOR STRUCTURE AND METHOD OF FORMING THE SAME

CROSS REFERENCE TO RELATED APPLICATIONS

This application claims the benefit of prior-filed application Ser. No. 14/689,786, filed Apr. 17, 2015, under 35 U.S.C. 120.

FIELD

The present disclosure relates generally to a semiconductor structure and more particularly relates to a three dimensional transistor.

BACKGROUND

For integrated circuit manufacturers, one of the several strategies employed for improving integration level and reducing manufacturing cost of integration circuits is the introduction of multi-gate devices (e.g., a multiple gate field-effect transistor, which incorporates more than one gate into a single transistor). The multi-gate device, such as a fin field effect transistor (FinFET), is proposed to replace the conventional planar MOSFET since it is getting harder and harder to reduce the physical dimension of the conventional planar MOSFET.

However, according to conventional fabrication techniques, it is very likely that the gate structures of FinFETs would get in direct contact with one another as the size of ICs get smaller. Accordingly, what is needed are FinFET structures that can prevent the shorting of adjacent metal gates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5J schematically illustrate a method of forming a semiconductor structure in accordance with one embodiment of the present disclosure.

DETAILED DESCRIPTION

Figure 1:
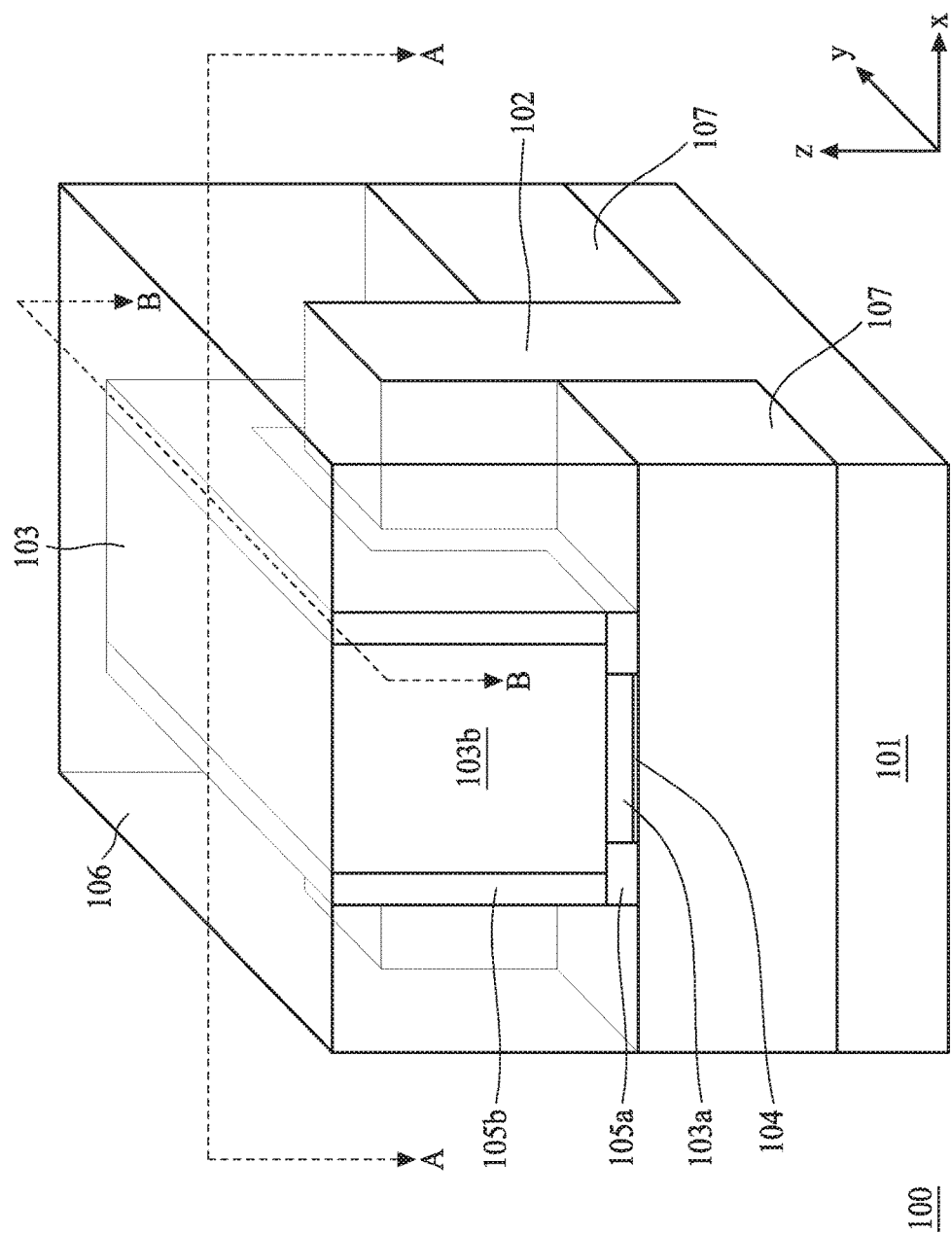
FIG. 1 is a schematic diagram illustrating a semiconductor structure in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

According to existing metal gate fabrication techniques used in fabricating MOSFETs, FinFETs or other types of field effect transistors, an uniform undercut profile for a metal gate structure (e.g., a metal gate structure having vertical sidewalls rather than outwardly slanted sidewalls) is not easily obtainable due to difficulty in uniform etching of polysilicon gate structure. Accordingly, there often exists a problem of metal gate footing, which would cause the shorting of adjacent metal gates. In addition, for a FinFET device, conventional metal gate fabrication techniques would often result in an undesirable fin top damage caused by some etching processes. Accordingly, what is needed are FinFET structures that can prevent the shorting of adjacent metal gates and also prevent the undesirable fin top damage.

In order to solve the aforementioned problems, the present disclosure provides a semiconductor structure (and a method for forming the same) with indented gate segment at the interface with the substrate/fin (e.g., with the presence of an uniform undercut at the interface) so as to prevent the shorting of adjacent metal gates. Furthermore, the problem of an undesirable fin top damage can also be solved by means of an additional layer with relatively high conductivity according to the present disclosure.

In reference to the drawings, FIG. 1 is a schematic diagram illustrating a semiconductor structure 100 in accordance with one embodiment of the present disclosure. The semiconductor structure 100 may be a multi-gate non-planar field effect transistor (e.g., FinFET). As shown in FIG. 1, the semiconductor structure 100 includes: a substrate 101, a fin structure 102, a gate structure 103, a high K dielectric layer 104, dielectric sidewalls 105a and 105b, an inter-layer dielectric (ILD) layer 106 and isolation features 107.

The substrate 101 is an underlying layer which provides support to the semiconductor structure 100. The substrate 101 may be a bulk silicon substrate, epitaxial silicon substrate, silicon germanium substrate, silicon carbide substrate, silicon germanium substrate, or other group III-V compound substrate.

The fin structure 102 is formed as a thin, planar structure protruding from the substrate 101 and extends along a first direction (x direction in FIG. 1) and may be formed of the same material as the substrate 101. The fin structure 102 may include a source region, a drain region and a channel region (not shown). The source region and the drain region are separated by the channel region, which is wrapped-around by the gate structure 103. The width of the gate structure 103 (measured in the x direction in FIG. 1) determines the effective channel length of the semiconductor structure 100. The wrap-around gate structure 103 provides a better electrical control and thus helps in reducing the leakage current and overcoming other short-channel effects.

The isolation feature 107 disposed on both sides of the fin structure 102 may be shallow trench isolation (STI) features that can prevent electrical current leakage between adjacent fin structures 102 (or adjacent semiconductor structures 100). The isolation feature 107 may be formed by the following steps: etching a pattern of trenches in the substrate 101, depositing one or more dielectric materials (such as silicon dioxide) to fill the trenches, and removing the excess dielectric thereby exposing the top of the fin structure 102. The isolation features 107 can be formed by, wet or dry thermal oxidation, physical vapor deposition (PVD), atomic layer deposition (ALD), high density plasma CVD (HDP-CVD), other suitable methods, and/or combinations thereof. In one embodiment, the isolation feature 107 may be formed of silicon dioxide. The isolation feature 107 may have a multilayer structure, for example, a thermal oxide liner layer with silicon oxide or silicon nitride formed over the liner.

The gate structure (gate electrode) 103 is arranged on the isolation features 107 to straddle the fin structure 102 and runs in a second direction (y direction in FIG. 1) substantially perpendicular to the first direction, along which the fin structure 102 extends (x direction in FIG. 1). The gate structure 103 can be formed of any suitable gate electrode material. In one exemplary embodiment, the gate structure 103 could be a metal gate electrode formed by, such as, but not limited to, copper, ruthenium, palladium, platinum, cobalt, nickel, ruthenium oxide, tungsten, aluminum, titanium, tantalum, titanium nitride, tantalum nitride, hafnium, zirconium, a metal carbide, or a conductive metal oxide. It should also be appreciated that the gate structure 103 needs not be a single material, but could include a composite stack of thin films.

The high K dielectric layer 104 is disposed between the fin structure 102 and the gate structure 103 and disposed between the isolation features 107 and the gate structure 103. The high K dielectric layer 104 can be formed from any gate dielectric material. In one embodiment, the high K dielectric layer 104 include a silicon dioxide, silicon oxynitride or a silicon nitride dielectric layer. The thickness of the high K dielectric layer 104 may be between about 5 Å to about 20 Å. The high K dielectric layer 104 may have a k value greater than about 7.0, and may include an oxide or a silicate of Hf, Al, Zr, La, Mg, Ba, Ti, Pb, and combinations thereof. Exemplary materials of the high K dielectric layer 104 include $MgO_x$, $BaTi_xO_y$, $BaSr_xTi_yO_z$, $PbTi_xO_y$, $PbZr_xTi_yO_z$, and the like, with values X, Y, and Z being between 0 and 1. The high K dielectric layer 104 may be formed by Molecular-Beam Deposition (MBD), Atomic Layer Deposition (ALD), Physical Vapor Deposition (PVD), and the like.

The ILD layer 106 is used for electrical separation and features low dielectric constant k to minimize capacitive coupling. The ILD layer 106 may be formed by chemical vapor deposition (CVD), high density plasma CVD (HDP-CVD), spin-on deposition, physical vapor deposition (PVD or sputtering), or other suitable methods. The ILD layer 106 may include silicon oxide, silicon oxynitride, a low-k material, and/or other suitable dielectric. The ILD layer 106 may be formed on and surrounding the gate structure 103 and the fin structure 102.

According to one embodiment of the present disclosure, the gate structure 103 includes a first segment 103a and a second segment 103b. The second segment 103b is over the first segment 103a and is separated from the underlying fin structure 102 and isolation features 107 by the first segment 103a. The first segment 103a and the second segment 103b of the gate structure 103 may be formed using the same material or fabrication process. In one embodiment, the first segment 103a is sandwiched between dielectric sidewalls 105a and the second segment 103b is sandwiched between dielectric sidewalls 105b. In one embodiment, the dielectric sidewalls 105a may be silicon oxide sidewalls doped with group III or group V elements (group III element/dopant may include arsenic (As), phosphorous (P) or antimony (Sb) whereas group III dopants may include boron (B)). The concentration of the group III or group V element in the dielectric sidewalls 105a ranges from about 1E19 to about $1E22$ atoms/cm$^3$. In one embodiment, the dielectric sidewalls 105b may be silicon oxide sidewalls doped with carbon or nitrogen with a concentration ranging from about 5E18 to about 1E21 atoms/cm$^3$.

According to one embodiment of the present disclosure, the first segment 103a and the second segment 103b are such configured that the second segment 103b has a greater dimension measured in the first direction (x direction in FIG. 1) than that of the first segment 103a, or, to put it in another way, the width of the first segment 103a is smaller than the width of the second segment 103b. Such a configuration/arrangement can efficiently prevent a gate footing profile, which causes shorting between adjacent gate structures (e.g., adjacent gates straddling the same fin structure). Gate footing is a common defect in metal gate fabrication process.

Figure 2:
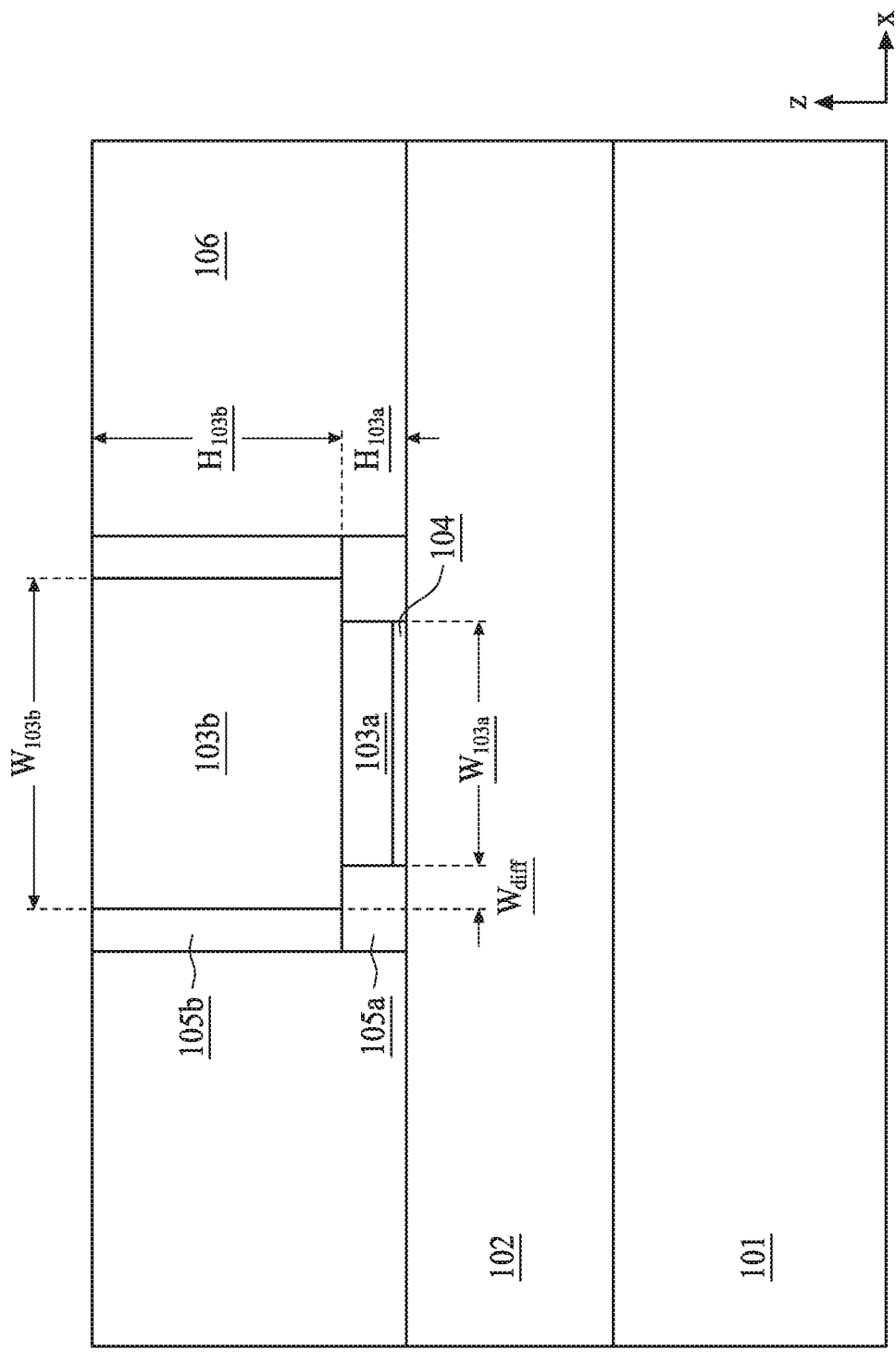
FIG. 2 is a cross-sectional view illustrating a semiconductor structure in accordance with FIG. 1 of the present disclosure.

FIG. 2, which is a cross-sectional view illustrating the semiconductor structure 100 of FIG. 1 obtained from the plane crossing line A-A in FIG. 1, shows in detail the geometrical configuration of the first segment 103a and the second segment 103b. In FIG. 2, the parameter $W_{103a}$ designates the width of the first segment 103a and the parameter $W_{103b}$ designates the width of the second segment 103b. Since the parameter $W_{103b}$ is selected to be greater than the parameter $W_{103a}$, an undercut region (not shown) would appear on both sides of the first segment 103a. As stated above, the undercut region can prevent shorting between adjacent gate structures. In one embodiment, the parameters $W_{103a}$ and $W_{103b}$ are such selected that $W_{103b}$ is greater than $W_{103a}$ by about 2 nm to about 6 nm. In one embodiment, the parameters $W_{103a}$ and $W_{103b}$ are such selected that $W_{103b}$ is greater than $W_{103a}$ by about 3 nm to about 5 nm. In one embodiment, the parameters $W_{103a}$ and $W_{103b}$ are such selected that $W_{103b}$ is greater than $W_{103a}$ by about 4 nm. The parameter $W_{diff}$ designates the width difference between the first segment 103a and the second segment 103b on one side of the first segment 103a (namely the width of the undercut region). In one embodiment, the parameter $W_{diff}$ ranges from about 1 nm to about 3 nm. In one embodiment, the parameter $W_{diff}$ is about 2 nm. Additionally, the parameter $H_{103a}$ designates the height of the first segment 103a and the parameter $H_{103b}$ designates the height of the second segment 103b. In one embodiment, the parameter $H_{103a}$ ranges from about 5 nm to about 50 nm. In one embodiment, the parameter $H_{103a}$ ranges from about 5 nm to about 20 nm. In one embodiment, the parameter $H_{103a}$ ranges from about 5 nm to about 10 nm. In one embodiment, the ratio of $H_{103b}$ to $H_{103a}$ ranges from about 2 to about 6. In one embodiment, the ratio of $H_{103b}$ to $H_{103a}$ ranges from about 3 to about 5. In one embodiment, the ratio of $H_{103b}$ to $H_{103a}$ is about 4.

Figure 3:
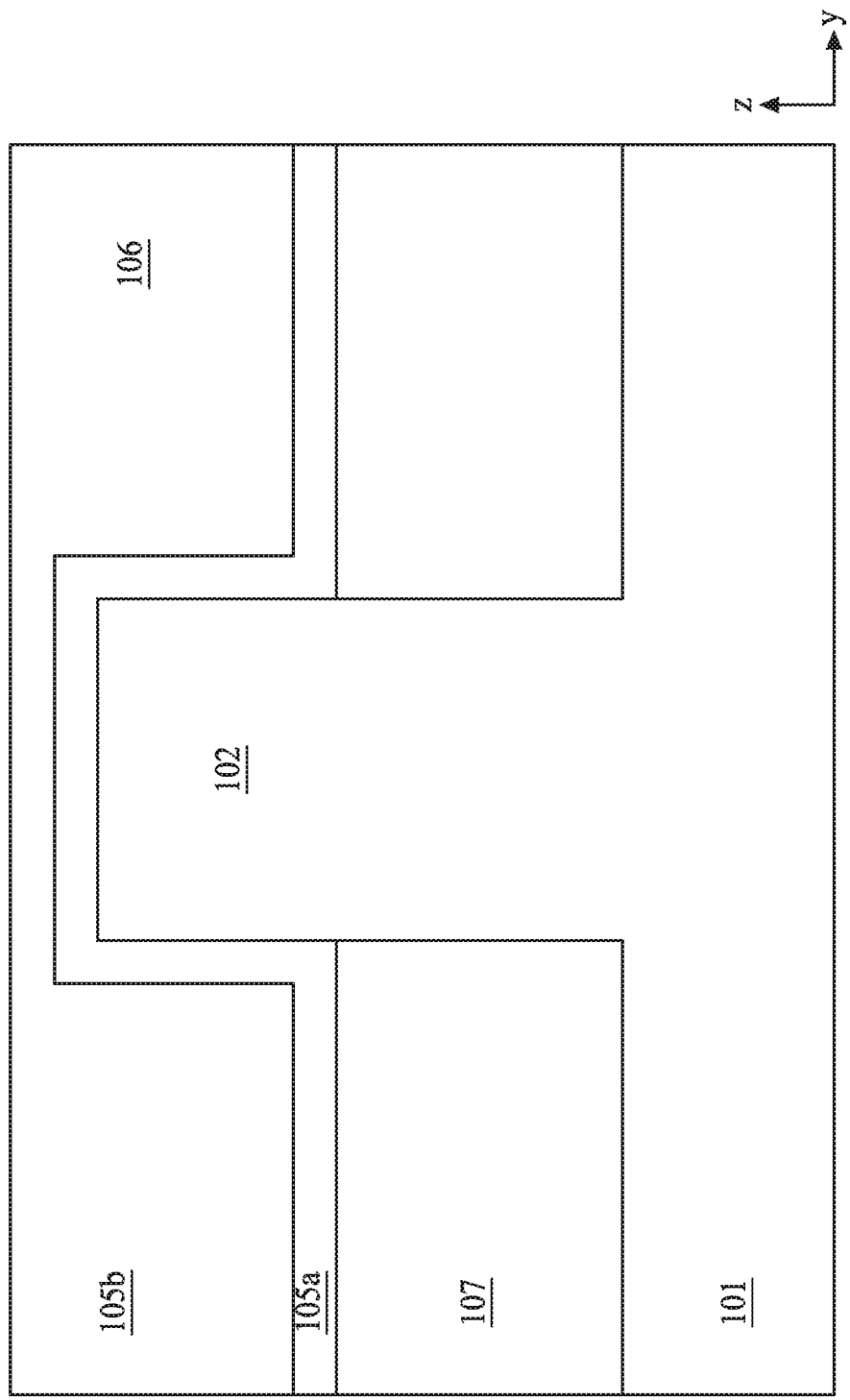
FIG. 3 is a cross-sectional view illustrating a semiconductor structure in accordance with FIG. 1 of the present disclosure.

FIG. 3 is a cross-sectional view illustrating the semiconductor structure 100 of FIG. 1 obtained from the plane crossing line B-B in FIG. 1 (note that the line B-B in FIG. 1 runs through the area right above the dielectric sidewall 105b on the right). FIG. 3 shows that the dielectric sidewalls 105a substantially cover the fin structure 102.

Figure 4A:
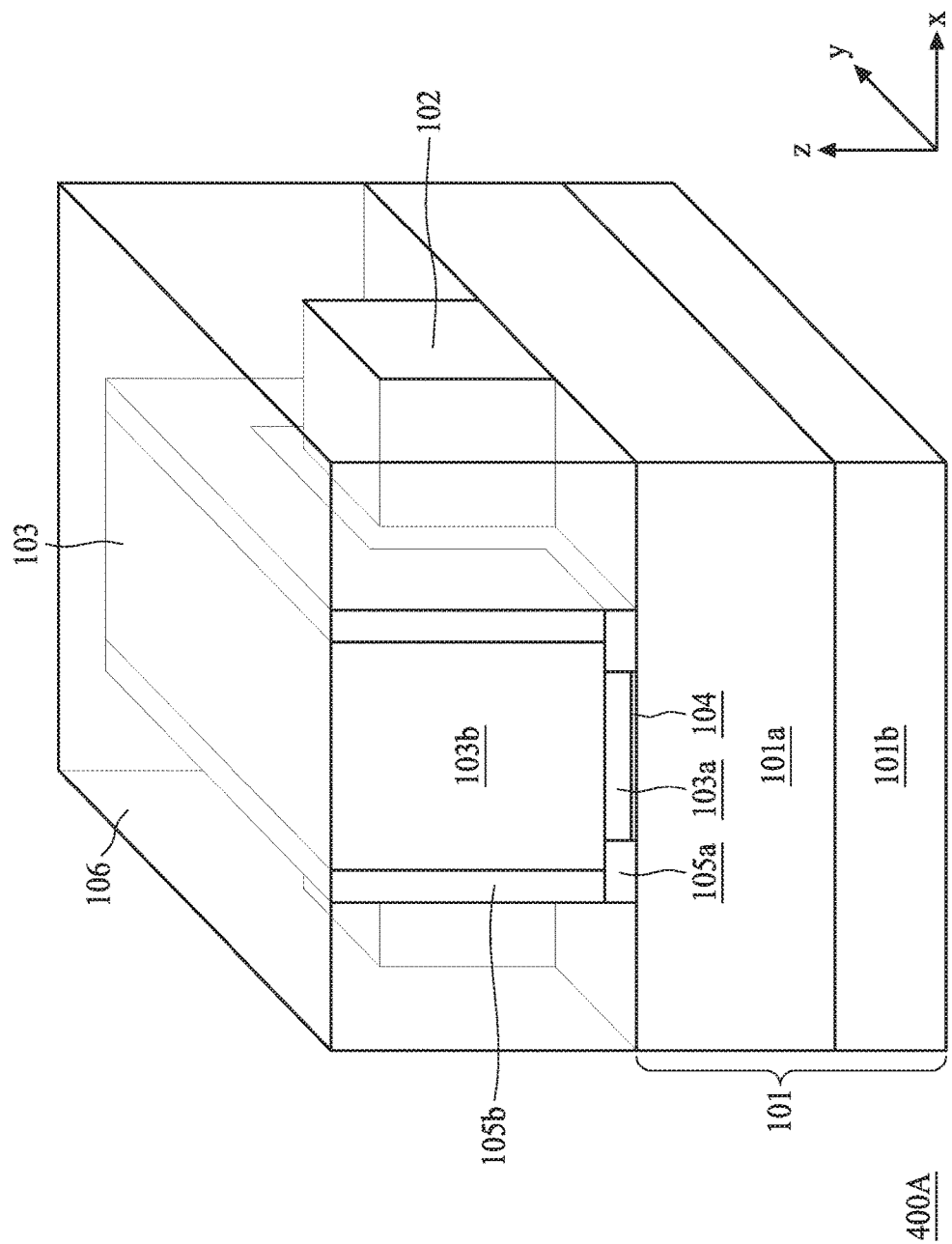
FIG. 4A is a schematic diagram illustrating a semiconductor structure in accordance with one embodiment of the present disclosure.

FIG. 4A is a schematic diagram illustrating a semiconductor structure 400A in accordance with one embodiment of the present disclosure. The semiconductor structure 400A includes: a substrate 101, a fin structure 102, a gate structure 103, a high K dielectric layer 104, dielectric sidewalls 105a and 105b and an ILD layer 106.

The substrate 101 may be a semiconductor-on-insulator (SOI) substrate at least including a buried oxide (BOX) layer 101a and a base substrate layer 101b. The material of the BOX layer 101a may be $SiO_2$. The thickness of the BOX layer 101a may be greater than 100 nm. The base substrate layer 101b may be formed from silicon, germanium or III-V compounds (e.g., silicon carbide, gallium, arsenic indium or indium phosphide).

The fin structure 102 is a thin, planar structure formed on the BOX layer 101a of the substrate 101 and runs in a first direction (x direction in FIG. 4). The gate structure 103 is formed on the BOX layer 101a of the substrate 101 and is arranged to straddle the fin structure 102. The gate structure 103 runs in a second direction (y direction in FIG. 4) substantially perpendicular to the first direction (x direction in FIG. 4). The high K dielectric layer 104 is disposed between the fin structure 102 and the gate structure 103 and between the BOX layer 101a and the gate structure 103. The gate structure 103 includes a first segment 103a and a second segment 103b over the first segment 103a. The first segment 103a is sandwiched between dielectric sidewalls 105a and the second segment 103b is sandwiched between dielectric sidewalls 105b. In one embodiment, the dielectric sidewalls 105a may be silicon sidewalls doped with group III or group V elements and the dielectric sidewalls 105b may be may be silicon sidewalls doped with carbon or nitrogen. The ILD layer 106 of the semiconductor structure 400A may be formed on and surrounding the gate structure 103 and the fin structure 102.

The fin structure 102 of the semiconductor structure 400A differs from the fin structure 102 of the semiconductor structure 100 mainly in that the former is formed on the BOX layer 101a over the substrate 101 of the semiconductor structure 400A while the latter is penetrating through the isolation structure 107 and connecting tithe substrate 101 of the semiconductor structure 100.

For the semiconductor structure 400A, the width of the first segment 103a is selected to be smaller than the width of the second segment 103b for preventing shorting between adjacent gate structures. Since the cross-sectional view of the semiconductor structure 400A is sustainably the same as that of the semiconductor structure 100, the dimension parameters of the semiconductor structure 400A noted below will be discussed with reference to the dimension parameters shown in FIG. 2 (namely the cross-sectional view illustrating the semiconductor structure 100 of FIG. 1 obtained from the plane crossing line A-A in FIG. 1). For semiconductor structure 400A, the width of the second segment $W_{103b}$ is greater than the width of the first segment 103a by about 2 nm to about 6 nm. In one embodiment, $W_{103b}$ is greater than $W_{103a}$ by about 3 nm to about 5 nm. In one embodiment, $W_{103b}$ is greater than $W_{103a}$ by about 4 nm. In one embodiment, the width difference between the first segment 103a and the second segment 103b on one side of the first segment 103a ($W_{diff}$) ranges from about 1 nm to about 3 nm. In one embodiment, the parameter $W_{diff}$ is about 2 nm. In one embodiment, the height of the first segment 103a $H_{103a}$ ranges from about 5 nm to about 50 nm. In one embodiment, $H_{103a}$ ranges from about 5 nm to about 20 nm. In one embodiment, the ratio of $H_{103b}$ (the height of the second segment 103b) to $H_{103a}$ ranges from about 2 to about 6. In one embodiment, the ratio of $H_{103b}$ to $H_{103a}$ ranges from about 3 to about 5. In one embodiment, the ratio of $H_{103b}$ to $H_{103a}$ is about 4.

Figure 4B:
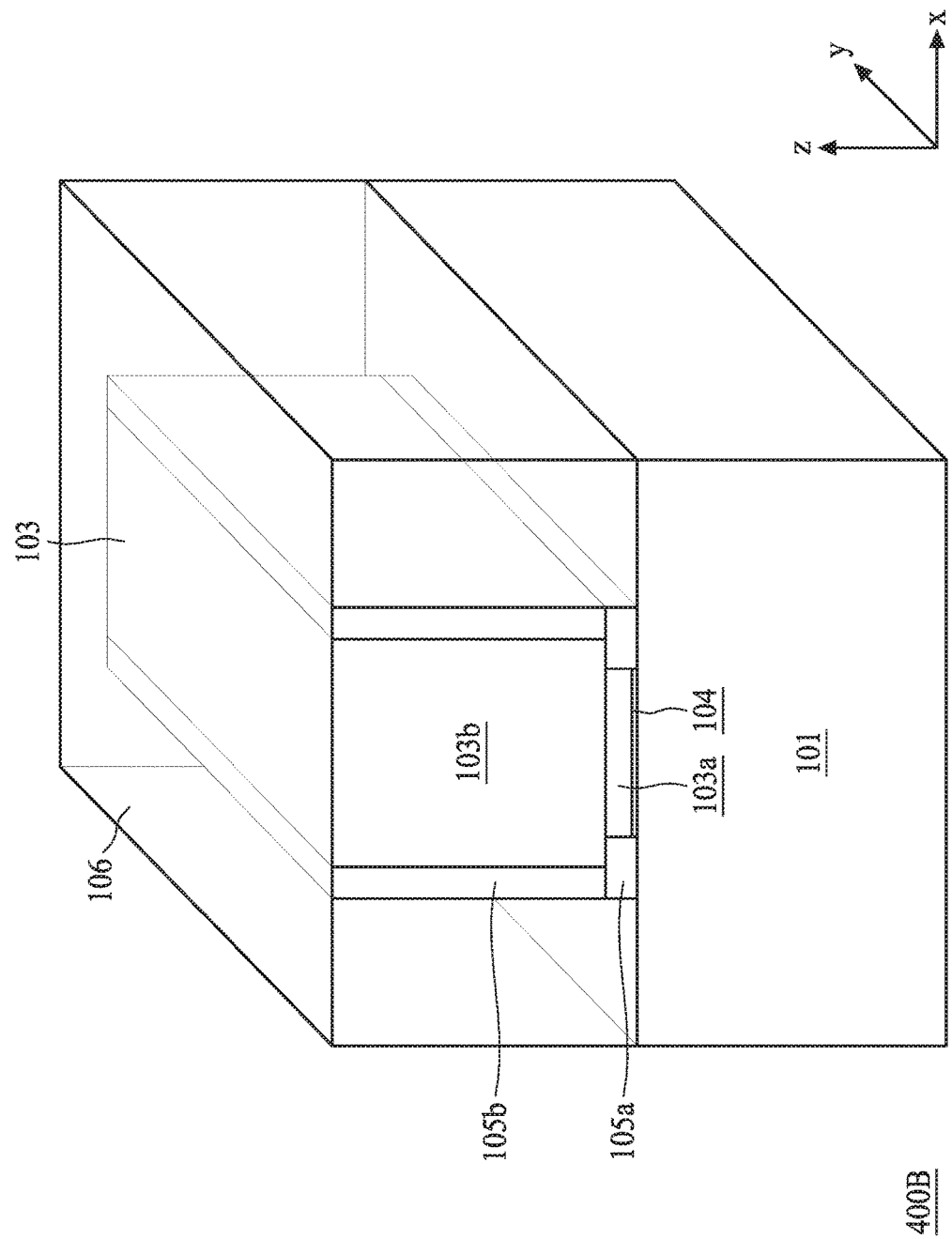
FIG. 4B is a schematic diagram illustrating a semiconductor structure in accordance with one embodiment of the present disclosure.

FIG. 4B is a schematic diagram illustrating a semiconductor structure 400B in accordance with one embodiment of the present disclosure. The semiconductor structure 400B includes: a substrate 101, a gate structure 103, a high K dielectric layer 104, dielectric sidewalls 105a and 105b and an ILD layer 106. In one embodiment, the semiconductor structure 400B is a planar MOSFET wherein a source region, a drain region and a channel region (not shown) are formed within the substrate 101.

For the semiconductor structure 400B, the width of the first segment 103a is selected to be smaller than the width of the second segment 103b for preventing shorting between adjacent gate structures. Similarly, since the cross-sectional view of the semiconductor structure 400B is sustainably the same as that of the semiconductor structure 100, the dimension parameters of the semiconductor structure 400B are substantially the same as those shown in FIG. 2.

Figure 5B:
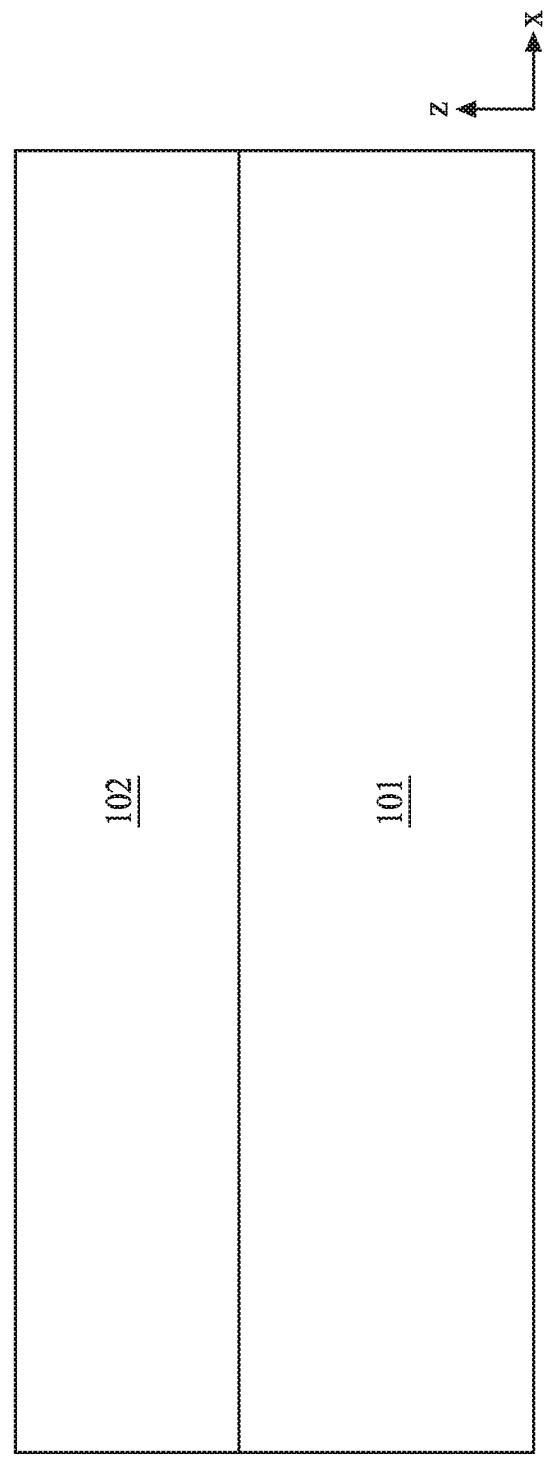

FIGS. 5A-5J schematically illustrate a method of forming a semiconductor structure (e.g., FinFET) in accordance with one embodiment of the present disclosure. In FIG. 5A (operation 5A), a substrate 101 is provided. The substrate 101 may be an SOI substrate at least including a BOX layer and a base substrate layer (not shown). The material of the BOX layer may be $SiO_2$ and the base substrate layer may be formed from silicon, germanium or III-V compounds. In other embodiments, the substrate 101 can be a silicon substrate.

In FIG. 5B (operation 5B), a thin, planar fin structure 102 is formed on a surface of the substrate 101. The fin structure 102 is formed on the substrate 101 along a first direction (x direction). In one embodiment, the substrate 101 is an SOI substrate including a top silicon layer, a BOX layer and a base substrate layer (not shown), wherein forming a fin structure 102 on the substrate 101 includes etching away a portion of the top silicon layer to define the fin structure 102 (namely remaining portion of the top silicon layer) on the BOX layer. In one embodiment, the substrate 101 is a bulk silicon substrate and forming a fin structure 102 on the substrate 101 includes etching away a portion of the substrate 101 to form parallel trenches on the substrate 101 so as to define a fin structure 102 on the substrate 101.

Figure 5C:
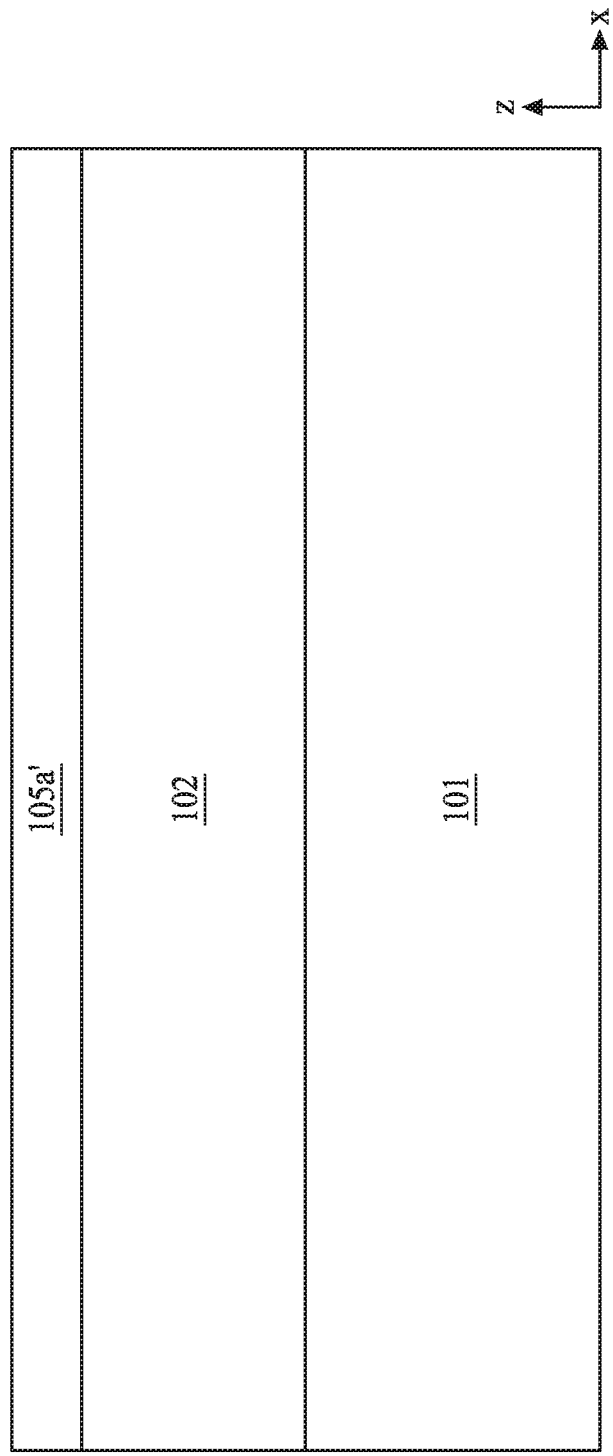

In FIG. 5C (operation 5C), a first silicon layer 105a' is formed over the fin structure 102. In one embodiment, a gate oxide layer (not shown) is formed over the fin structure 102 prior to the formation of the first silicon layer 105a'. Namely the gate oxide layer is first formed over the fin structure 102 and then the first silicon layer 105a' is formed over the gate oxide layer. In one embodiment, the first silicon layer 105a' is formed under a temperature from about 450 degrees Celsius to about 650 degrees Celsius, for example, from about 480 degrees Celsius to about 620 degrees Celsius. In one embodiment, the first silicon layer 105a' is formed under a pressure from about 0.2 torr to about 5.0 torr. In one embodiment, forming the first silicon layer 105a' includes growing a silicon layer in-situ doped with a group III or group V element, wherein an in-situ doping operation includes growing a silicon layer with dopant gas being concurrently introduced. In one embodiment, the dopant gas includes the group III or group V element. For example, in a CVD operation for in-situ forming the first silicon layer 105a', the growing gases include silane ($SiH_4$), diborane ($B_2H_6$) and $H_2$, wherein the $SiH_4$ is used for growing the first silicon layer while $B_2H_6$ provides the dopant for the first silicon layer. In one embodiment, a concentration of the group III or group V element in the first silicon layer 105a' ranges from about 1E18 to about 5E22 atoms/cm$^3$. In one embodiment, a concentration of the group III or group V element in the first silicon layer 105a' ranges from about 1E19 to about 5E22 atoms/cm$^3$. In one embodiment, a concentration of the group III or group V element in the first silicon layer 105a' ranges from about 1E19 to about 1E22 atoms/cm$^3$. With the concentration of the group III or group V element in the first silicon layer 105a' being from about 1E19 to about 1E22 atoms/cm$^3$, the first silicon layer 105a' would be a layer relatively more conductive than a silicon layer without introducing dopants.

In one embodiment, forming the first silicon layer 105a' over the fin structure 102 includes forming a first silicon layer 105a' ex-situ doped with the group III or group V element, namely the first silicon layer 105a' is formed prior to the doping of the group III or group V element.

In FIG. 5D (operation 5D), a second silicon layer 105b' is formed over the first silicon layer 105a'. In some embodiments, the second silicon layer 105b' is a doped silicon layer without typical group III and/or group V dopants. For example, the second silicon layer 105b' may include carbon or nitrogen. In other embodiments, the second silicon layer 105b' is a doped silicon layer with typical group III and/or group V dopants, yet the dopant concentration in the second silicon layer 105b' is measurably lower than that in the first silicon layer 105a'. In one embodiment, the temperature and the pressure used for depositing the first silicon layer 105a' and the second silicon layer 105b' are substantially the same. In one embodiment, the second silicon layer 105b' is formed under a temperature from about 450 degrees Celsius to about 650 degrees Celsius, for example, from about 480 degrees Celsius to about 620 degrees Celsius. In one embodiment, the second silicon layer 105b' is formed under a pressure from about 0.2 torr to about 5.0 torr. Gases including $SiH_4$, $C_2H_4$ and/or $H_2$ are also introduced during the formation of the second silicon layer 105b'. In one embodiment, forming the second silicon layer 105b' includes growing a silicon layer in-situ (or ex-situ, namely the implant operation of carbon and/or nitrogen performed after the formation of a silicon layer) doped with a carbon or nitrogen. In one embodiment, a concentration of carbon and/or nitrogen in the second silicon layer 105b' ranges from about 1E18 to about 5E22 atoms/cm$^3$. In one embodiment, a concentration of the carbon and/or nitrogen in the second silicon layer 105b' ranges from about 1E19 to about 5E22 atoms/cm$^3$. In one embodiment, a concentration of the carbon and/or nitrogen in the second silicon layer 105b' ranges from about 5E18 to about 1E21 atoms/cm$^3$. The first silicon layer 105a' and the second silicon layer 105b' are such formed that the oxidation rate of the first silicon layer 105a' is substantially greater than that of the second silicon layer 105b'.

Figure 5E:
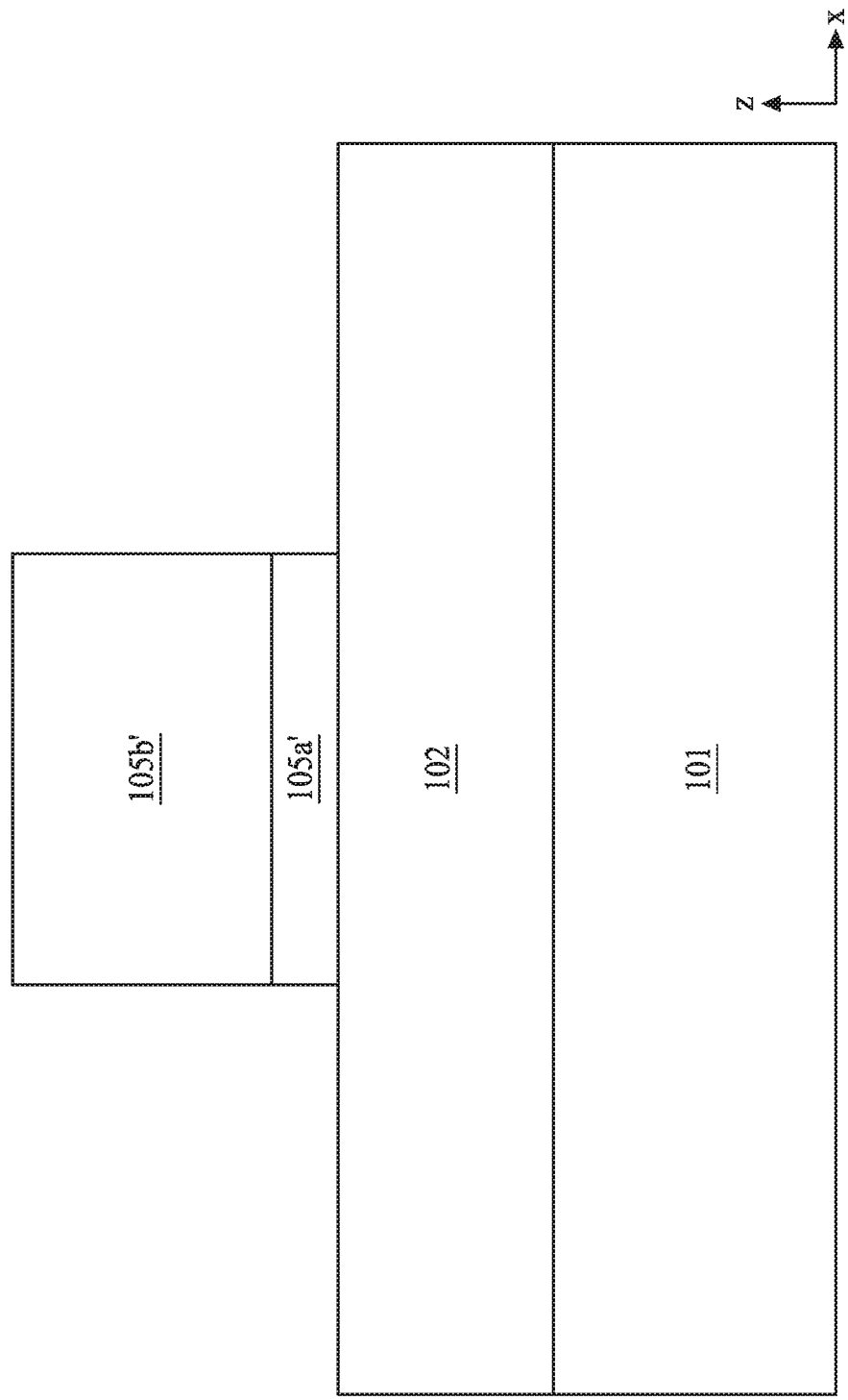

In FIG. 5E (operation 5E), the first silicon layer 105a' and the second silicon layer 105b' are patterned to form a dummy gate stack (the 105a'/105b' stack in FIG. 5E) over the fin structure 102 and extending along a second direction perpendicular to the first direction along which the fin structure 102 extends. Patterning the first silicon layer 105a' and the second silicon layer 105b' includes etching away a portion of the first silicon layer 105a' and the second silicon layer 105b' such that the remaining portion forms a dummy gate stack (the 105a'/105b' stack in FIG. 5E) over the fin structure 102. The etching process may include wet etching and dry etching. For the wet etching process, the exposed surface of a layer to be etched is dissolved when immersed in a bath of liquid-phase ("wet") etchants, which must be agitated to achieve good process control, wherein wet etchants are usually isotropic. For the dry etching process, the exposed surface of a substrate is bombarded by ions (usually a plasma of reactive gases such as fluorocarbons, oxygen, chlorine, boron trichloride; sometimes with addition of nitrogen, argon, helium and other gases). Unlike with many of the wet chemical etchants used in wet etching, the dry etching process typically etches directionally or anisotropically. The dry etching process includes ion milling (sputter etching), reactive-ion etching (RIE), deep reactive-ion etching (DRIE) and so on. In some embodiments, a dry etching operation is followed by a wet etching operation for cleaning the bottom corners between patterns.

Figure 5F:
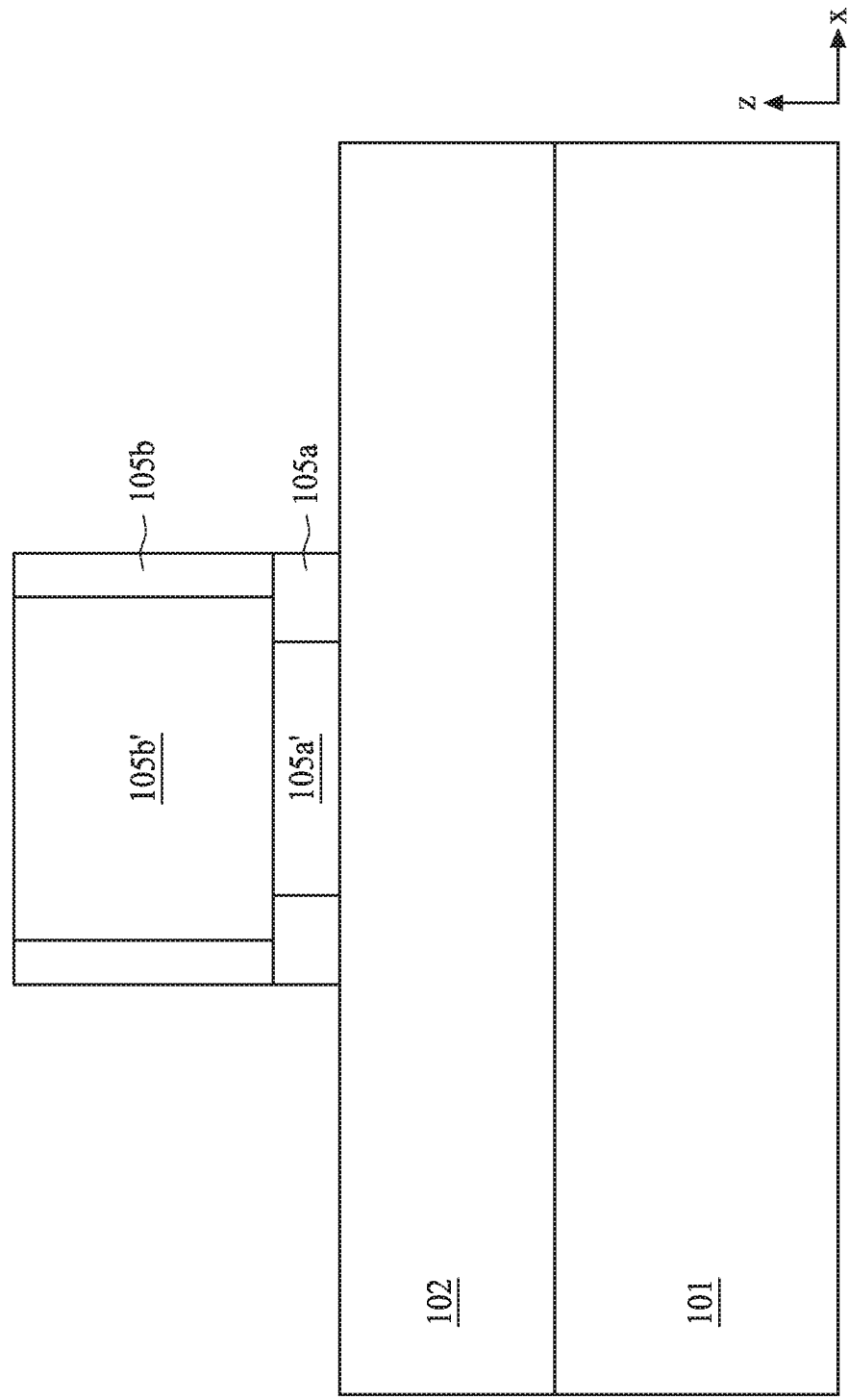

In FIG. 5F (operation 5F), the dummy gate stack (the 105a'/105b' stack) is further oxidized. In one embodiment, the dummy gate stack (the 105a'/105b' stack) is oxidized under a temperature from about 400 degrees Celsius to about 1000 degrees Celsius, preferably from 500 degrees Celsius to 950 degrees Celsius. In one embodiment, the dummy gate stack (the 105a'/105b' stack) is oxidized under a pressure from about 1 torr to about 120 torr, preferably from about 2 torr to about 100 torr. The oxidation process is performed with the introduction of $H_2/O_2$ with the percentage of $H_2$ being from about 0.4% to about 40%, preferably from about 0.5% to about 33%. Since the oxidation rate of the first silicon layer 105a' is substantially greater than that of the second silicon layer 105b', the oxidized portion of the first silicon layer 105a' (namely the oxidized portion 105a, corresponding to the dielectric sidewalls 105a in FIG. 1) would be thicker/wider (measured in the x direction) than that of the oxidized portion of the second silicon layer 105b' (namely the oxidized portion 105b, corresponding to the dielectric sidewalls 105b in FIG. 1). In other words, the un-oxidized portion of the first silicon layer 105a' (corresponding to the first segment 103a in FIGS. 1 and 2) would be narrower than that of the un-oxidized portion of the second silicon layer 105b' (corresponding to the second segment 103b in FIGS. 1 and 2). Since the configuration of FIG. 5F is substantially the same as that of FIG. 2, the dimension parameters of FIG. 5F noted below are to be discussed with reference to the dimension parameters shown in FIG. 2. In FIG. 5F, the width of the un-oxidized portion of the second silicon layer 105b' (corresponding to the second segment 103b in FIG. 2) is greater than the width of the un-oxidized portion of the first silicon layer 105a' (corresponding to the first segment 103a in FIG. 2) by about 2 nm to about 6 nm. In one embodiment, the width of the un-oxidized portion of the second silicon layer 105b' is greater than the width of the un-oxidized portion of the first silicon layer 105a' by about 3 nm to about 5 nm. In one embodiment, the width of the un-oxidized portion of the second silicon layer 105b' is greater than the width of the un-oxidized portion of the first silicon layer 105a' by about 4 nm. In one embodiment, the difference between the width of the un-oxidized portion of the first silicon layer 105a' and the un-oxidized portion of the second silicon layer 105b' on one side (of the un-oxidized portion of the first silicon layer 105a') ranges from about 1 nm to about 3 nm, preferably the width difference is about 2 nm. In one embodiment, the height of the first silicon layer 105a' ranges from about 5 nm to about 50 nm. In one embodiment, the height of the first silicon layer 105a' ranges from about 5 nm to about 20 nm. In one embodiment, the ratio of the height of the second silicon layer 105b' to the height of the first silicon layer 105a' ranges from about 2 to about 6. In one embodiment, the ratio of the height of the second silicon layer 105b' to the height of the first silicon layer 105a' ranges from about 3 to about 5. In one embodiment, the ratio of the height of the second silicon layer 105b' to the height of the first silicon layer 105a' is about 4.

In FIG. 5G (operation 5G), an ILD layer is formed over the fin structure 102 and around the dummy gate stack (the 105a'/105b' stack). The ILD layer 106 is used for electrical separation and features low dielectric constant k to minimize capacitive coupling. The ILD layer 106 may include silicon oxide, silicon oxynitride, a low-k material, and/or other suitable dielectric. In one embodiment, depositing the ILD layer further includes using a CMP process to expose the dummy gate stack (the 105a'/105b' stack).

Figure 5H:
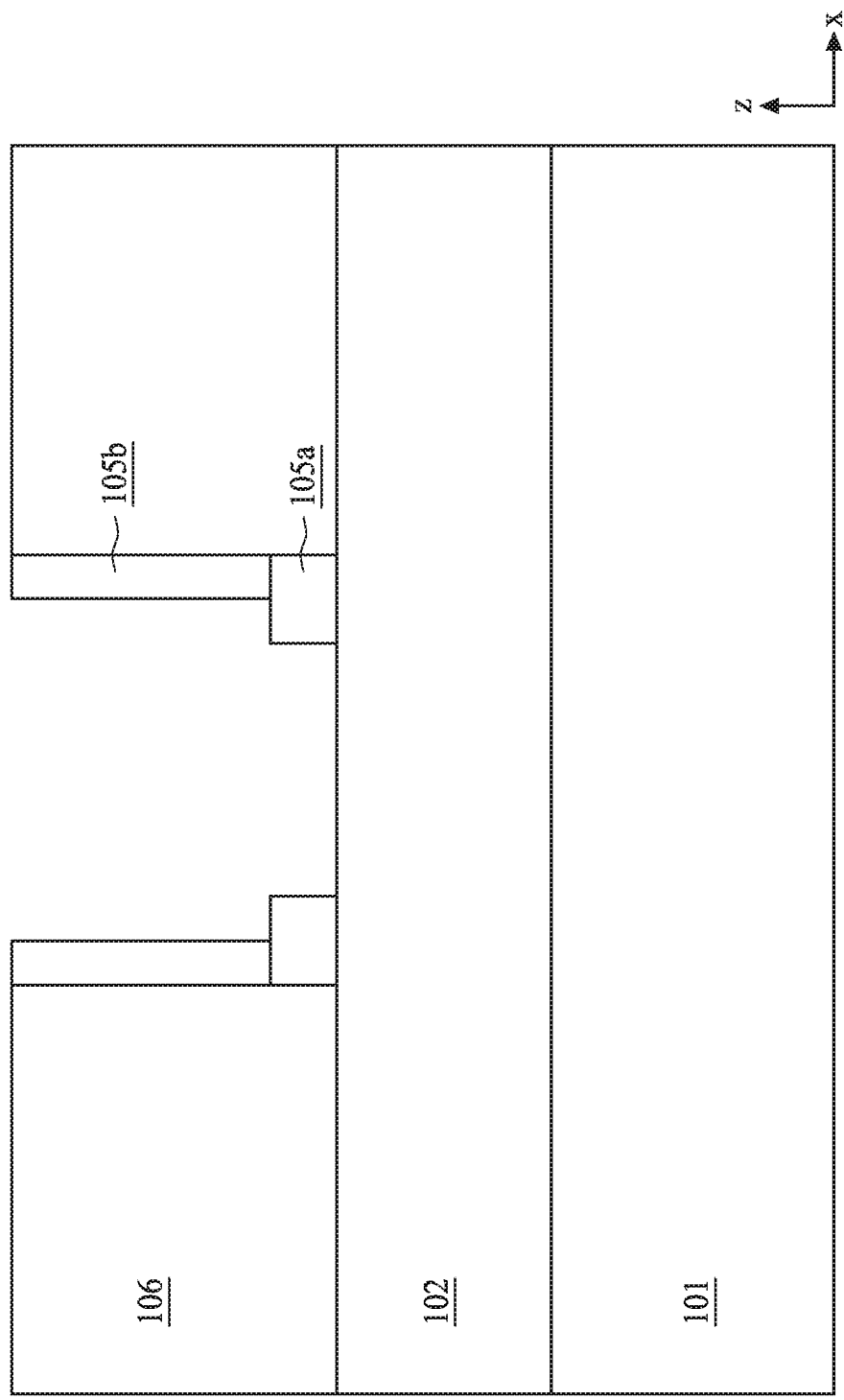

In FIG. 5H (operation 5H), the un-oxidized portion of the first silicon layer 105a' and the un-oxidized portion of the second silicon layer 105b' are etched away to define an opening. Note that the oxidized portion 105a and the oxidized portion 105b remains substantially intact due to the high selectivity of the etching process, namely only the un-oxidized portion, or polysilicon, would be etched away. Since the original gate oxide can be removed in this operation, the fin top is directly exposed to the dry/wet etchants. However, since the first silicon layer 105a' is a conductive layer, the underlying fin structure 102 can be protected from damage caused by dry etch process (plasma etching) or spin process during wet etching (e.g., damage caused by electrostatic charge accumulation).

Figure 5I:
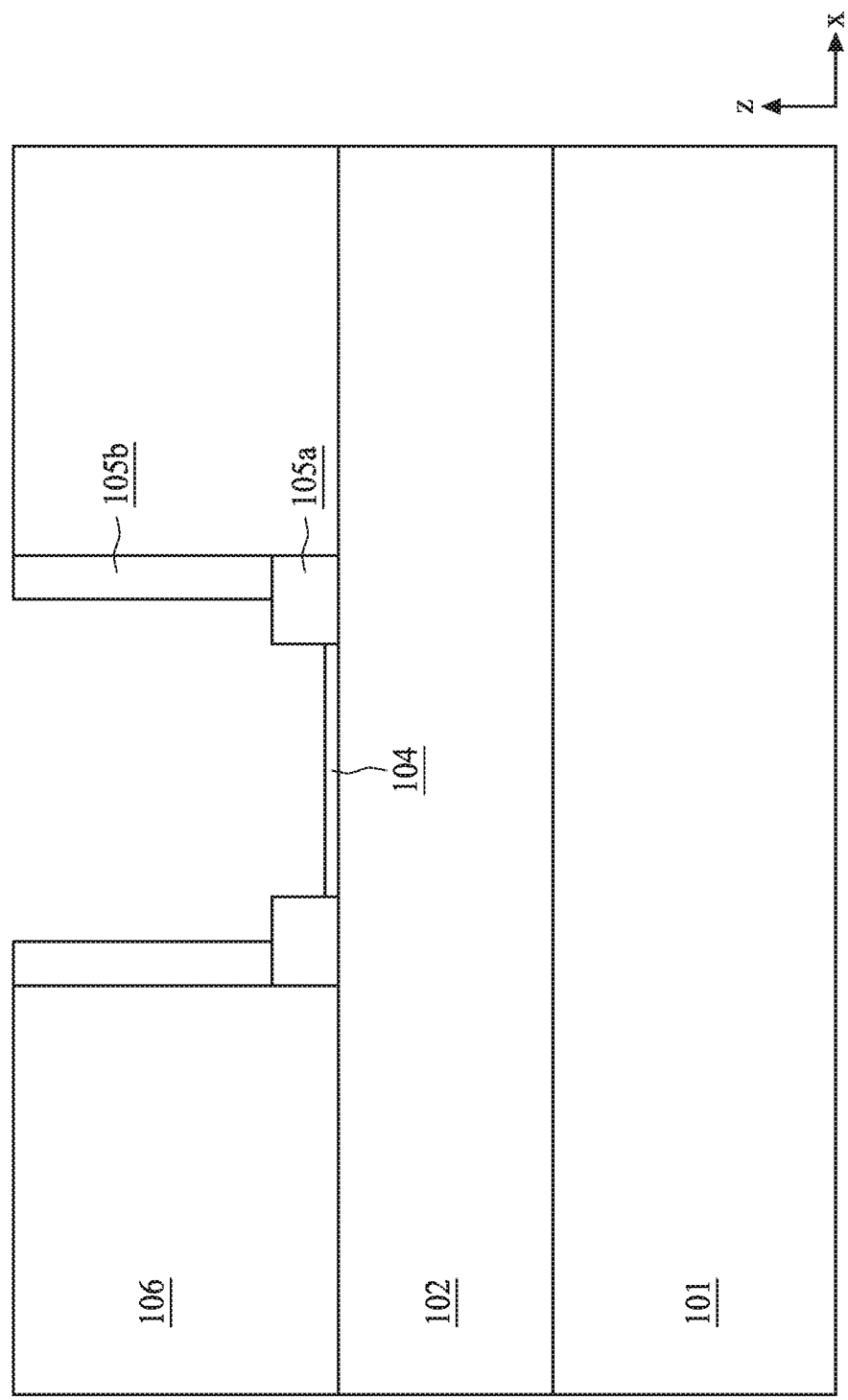

In FIG. 5I (operation 5I), a thin high K dielectric layer 104 is disposed in the opening and on the fin structure 102. The high K dielectric layer 104 can be formed from any gate dielectric material. In one embodiment, the high K dielectric layer 104 includes a silicon dioxide, silicon oxynitride or a silicon nitride dielectric layer. The thickness of the high K dielectric layer 104 may be between about 5 Å to about 20 Å. The high K dielectric layer 104 may have a k value greater than about 7.0.

Figure 5J:
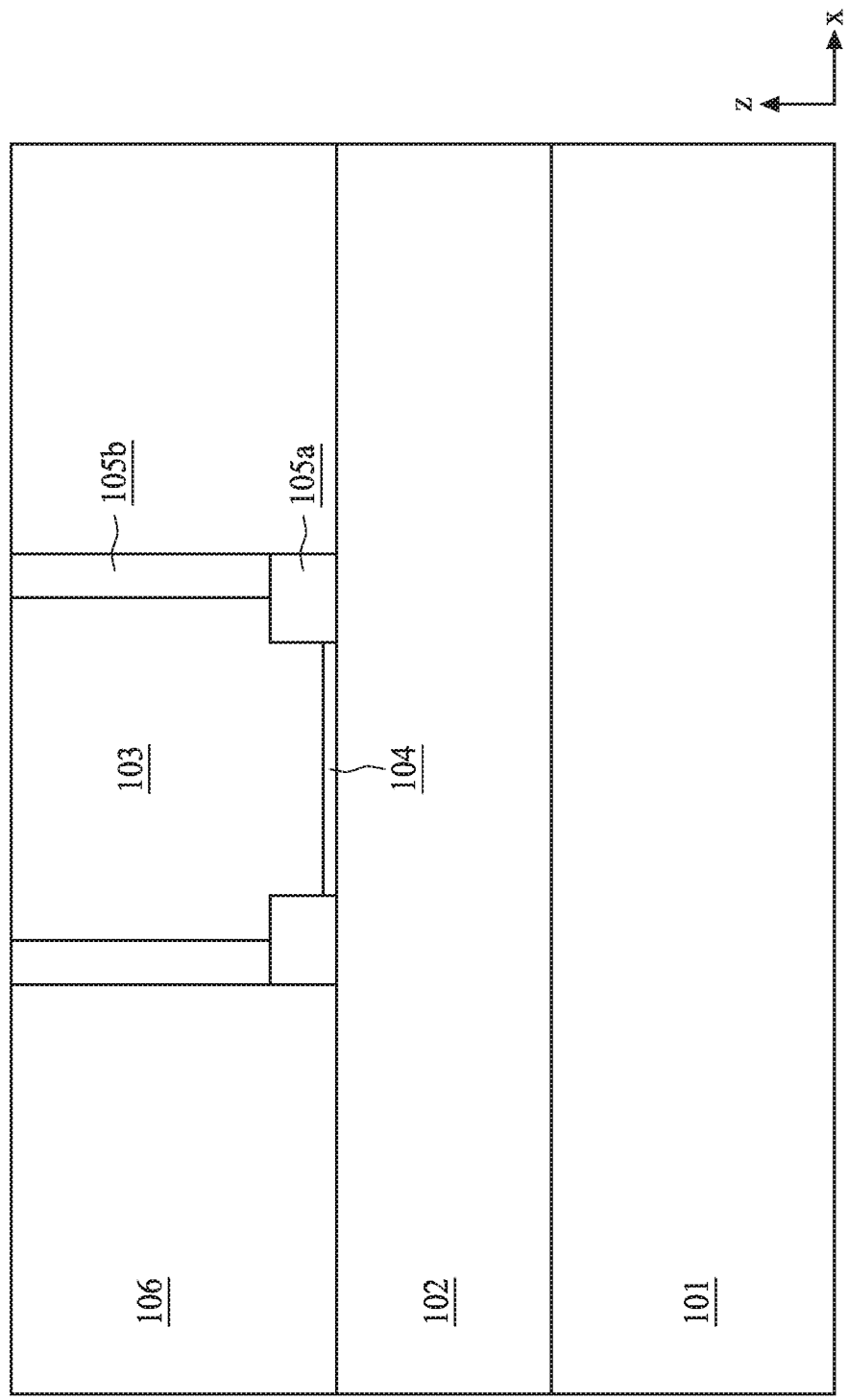

In FIG. 5J (operation 5J), a metal is deposited within the opening to form a gate structure 103. Metal deposition processes, such as CVD, PVD, ALD, sputtering, electroplating, or electroless plating, may be used to deposit the gate structure 103. The gate structure 103 could be a metal gate electrode, such as, but not limited to, copper, ruthenium, palladium, platinum, cobalt, nickel, ruthenium oxide, tungsten, aluminum, titanium, tantalum, titanium nitride, tantalum nitride, hafnium, zirconium, a metal carbide, or a conductive metal oxide. It should also be appreciated that the gate structure 103 needs not be a single material, but could include a composite stack of thin films. In one embodiment, depositing metal within the opening further includes using a CMP process to planarize the deposited metal.

Accordingly, the semiconductor structure fabricated based on the method shown in FIGS. 5A-5J would advantageously have a metal gate structure 103 with indented gate segment at the interface with the substrate/fin structure (e.g., an uniform undercut at the interface). Hence, the shorting of adjacent metal gates can be efficiently prevented. On contrast, for conventional fabrication processes, the metal gate structure would have outwardly slanted sidewalls (footing profile) due to non-uniform etching of polysilicon gate structure.

One embodiment of the present disclosure provides a semiconductor structure, comprising: a substrate; a fin structure protruding from the substrate, the fin structure extending along a first direction; isolation features disposed on both sides of the fin structure; a gate structure over the fin structure and extending on the isolation features along a second direction perpendicular to the first direction; and wherein the gate structure includes a first segment and a second segment, the second segment being over the first segment and including a greater dimension in the first direction than that of the first segment.

In one embodiment, a difference between the dimension of the first segment and the second segment ranges from about 2 nm to about 6 nm.

In one embodiment, the semiconductor structure further includes a high K dielectric layer between the fin structure and the first segment of the gate structure.

In one embodiment, the gate structure includes a metal gate.

In one embodiment, a height of the first segment ranges from about 5 nm to about 50 nm.

In one embodiment, the ratio of a height of the second segment to a height of the first segment ranges from about 2 to about 6.

In one embodiment, the first segment is sandwiched by dielectric sidewalls doped with group III or group V elements.

One embodiment of the present disclosure provides a semiconductor structure, including: a semiconductor substrate; a gate structure extending over the semiconductor substrate, wherein the gate structure includes a first segment and a second segment, the second segment being over the first segment and including a greater dimension in a direction perpendicular to which the gate structure extends than that of the first segment.

In one embodiment, a difference on one side between the dimension of the first segment and the second segment ranges from about 1 nm to about 3 nm.

In one embodiment, the ratio of a height of the second segment to a height of the first segment ranges from about 2 to about 6.

One embodiment of the present disclosure provides a method for forming a semiconductor structure including: forming a fin structure along a first direction on a semiconductor substrate; depositing a first layer over the semiconductor substrate and the fin structure; and depositing a second layer over the first layer, wherein depositing the first layer includes growing a silicon layer in-situ doped with a group III or group V element.

In one embodiment, the group III element includes boron.

In one embodiment, a concentration of the group III or group V element in the first silicon layer ranges from about 1E19 to about 1E22 atoms/cm3.

In one embodiment, depositing the second layer includes growing a silicon layer doped with carbon or nitrogen.

In one embodiment, the temperature and the pressure used for depositing the first layer and the second layer are substantially the same.

In one embodiment, the method further includes patterning the first layer and the second layer to form a dummy gate stack over the fin structure and extending along a second direction perpendicular to the first direction.

In one embodiment, the method further includes oxidizing the first layer and the second layer of the dummy gate stack.

In one embodiment, the oxidizing is performed under a pressure ranging from about 2 to about 100 torr.

In one embodiment, the oxidation rate of the first layer is greater than that of the second layer.

In one embodiment, the method further includes removing an un-oxidized portion of the dummy gate stack.

The methods and features of this disclosure have been sufficiently described in the above examples and descriptions. It should be understood that any modifications or changes without departing from the spirit of the disclosure are intended to be covered in the protection scope of the disclosure.

Moreover, the scope of the present application is not intended to be limited to the particular embodiments of the process, machine, manufacture, and composition of matter, means, methods and steps described in the specification. As those skilled in the art will readily appreciate from the disclosure of the present disclosure, processes, machines, manufacture, composition of matter, means, methods or steps presently existing or later to be developed, that perform substantially the same function or achieve substantially the same result as the corresponding embodiments described herein may be utilized according to the present disclosure. Accordingly, the appended claims are intended to include within their scope such as processes, machines, manufacture, compositions of matter, means, methods or steps/operations. In addition, each claim constitutes a separate embodiment, and the combination of various claims and embodiments are within the scope of the disclosure.

What is claimed is:

1. A semiconductor structure, comprising: a substrate; a fin structure protruding from the substrate, the fin structure extending along a first direction, the fin structure having a first length along the first direction; isolation features disposed on both sides of the fin structure; a gate structure over the fin structure and extending on the isolation features along a second direction perpendicular to the first direction; wherein the gate structure comprises a first segment and a second segment over the first segment, a dimension of the first segment along the first direction and a dimension of the second segment along the first direction being shorter than the first length, and the first segment is sandwiched by a first dielectric sidewalls doped with group III or group V elements, a high-k dielectric is between the fin structure and the first segment, surrounded by the first dielectric sidewalls; and a second dielectric sidewalls directly contacting the second segment.

2. The semiconductor structure of claim 1, wherein the second segment is sandwiched by the second dielectric sidewalls doped with carbon or nitrogen.

3. The semiconductor structure of claim 1, wherein the first segment and the second segment of the gate structure comprises metallic materials.

4. The semiconductor structure of claim 1, wherein a height of the first segment ranges from about 5 nm to about 50 nm.

5. The semiconductor structure of claim 1, wherein the ratio of a height of the second segment to a height of the first segment ranges from about 2 to about 6.

6. The semiconductor structure of claim 1, wherein the dimension of the second segment is greater than the dimension of the first segment.

7. The semiconductor structure of claim 6, wherein a difference between the dimension of the first segment and the second segment ranges from about 2 nm to about 6 nm.

8. The semiconductor structure of claim 1, wherein the first dielectric sidewalls comprises silicon oxide doped with group III or group V elements.

9. The semiconductor structure of claim 1, wherein the second dielectric sidewalls comprises silicon oxide doped with carbon or nitrogen.

10. A semiconductor device, comprising: a semiconductor substrate; a fin structure protruding from the semiconductor substrate, and a gate structure extending over the fin structure, wherein the gate structure comprises a first segment and a second segment, the second segment being over the first segment, the first segment and the second segment being sandwiched by dielectric sidewalls, and the dielectric sidewalls being orthogonally across the fin structure, and wherein the dielectric sidewalls comprise: a first dielectric sidewall surrounding the first segment, the first dielectric sidewall being doped with a first dopant; a second dielectric sidewall surrounding the second segment, the second dielectric sidewall being doped with a second dopant which comprises carbon or nitrogen; the first dopant comprising group III element; and wherein the first segment comprises a narrower dimension than the second segment between the dielectric sidewalls.

11. The semiconductor device of claim 10, wherein the first dielectric sidewall comprises group III element-doped silicon oxides and the second dielectric sidewall comprises carbon or nitrogen-doped silicon oxides.

12. The semiconductor device of claim 10, further comprising a high-k dielectric layer between the first segment and the semiconductor substrate.

13. The semiconductor device of claim 10, wherein a difference on one side between the dimension of the first segment and the second segment ranges from about 1 nm to about 3 nm.

14. The semiconductor device of claim 10, wherein the ratio of a height of the second segment to a height of the first segment ranges from about 2 to about 6.

15. A FinFET structure, comprising: a semiconductor fin; a metal gate orthogonally over the semiconductor fin, the metal gate comprising: a metal electrode having a narrower section in proximity to the semiconductor fin and a wider section over the narrower section; a first dielectric sidewall directly contacting the narrower section of the metal electrode; a second dielectric sidewall orthogonal to the first dielectric sidewall and directly contacting the wider section of the metal electrode, wherein the first dielectric sidewall is wider than the second dielectric sidewall; and a dielectric layer surrounding the metal gate, the first dielectric sidewall, and the second dielectric sidewall.

16. The FinFET structure of claim 15, further comprising a high-k dielectric between the semiconductor fin and the narrower section, surrounded by the first dielectric sidewall.

17. The FinFET structure of claim 15, wherein the first dielectric sidewall comprises group III or group V element-doped oxides.

18. The FinFET structure of claim 15, wherein the second dielectric sidewall comprises carbon or nitrogen-doped oxides.

* * * * *